United States Patent
Greenebaum et al.

(10) Patent No.: US 10,321,164 B2
(45) Date of Patent: Jun. 11, 2019

(54) SYSTEM AND METHOD FOR IMPROVING GRAPHICS AND OTHER SIGNAL RESULTS THROUGH SIGNAL TRANSFORMATION AND APPLICATION OF DITHERING

(71) Applicant: Apple Inc., Cupertino, CA (US)

(72) Inventors: Kenneth I. Greenebaum, San Carlos, CA (US); Eric L. Dacquay, Cupertino, CA (US); Ian C. Hendry, San Jose, CA (US)

(73) Assignee: Apple Inc., Cupertino, CA (US)

( * ) Notice: Subject to any disclaimer, the term of this patent is extended or adjusted under 35 U.S.C. 154(b) by 133 days.

(21) Appl. No.: 15/275,011

(22) Filed: Sep. 23, 2016

(65) Prior Publication Data

US 2017/0093434 A1 Mar. 30, 2017

Related U.S. Application Data

(60) Provisional application No. 62/234,520, filed on Sep. 29, 2015.

(51) Int. Cl.
*H03M 13/25* (2006.01)
*H03M 13/00* (2006.01)
(Continued)

(52) U.S. Cl.
CPC ......... *H04N 19/895* (2014.11); *G09G 3/2044* (2013.01); *G09G 3/2048* (2013.01); *H04N 19/12* (2014.11); *H04N 19/18* (2014.11); *H04N 19/60* (2014.11); *H04N 19/85* (2014.11); *G06T 3/20* (2013.01); *G06T 3/40* (2013.01); *G09G 2320/0285* (2013.01); *G09G 2340/00* (2013.01); *G09G 2340/0407* (2013.01); *G09G 2350/00* (2013.01); *G10L 19/005* (2013.01);
(Continued)

(58) Field of Classification Search
CPC .............. H03M 13/251; H03M 13/612; G09G 3/2044; G09G 3/2048; H04N 19/12; H04N 19/124; H04N 19/18; H04N 19/36; H04N 19/60; H04N 19/85; H04N 19/895; H04N 1/56; H04N 1/58; H04B 2001/70855; G11B 20/10; G11B 20/10009; G11B 20/10018; G11B 20/10037; G11B 20/10527; G06T 5/0002; G06T 3/20; G06T 3/40; G10L 19/005; G10L 19/26
See application file for complete search history.

(56) References Cited

U.S. PATENT DOCUMENTS

2015/0146107 A1* 5/2015 Greenebaum .......... H04N 5/202
 348/674
2015/0199970 A1* 7/2015 Kleijn ..................... G10L 19/26
 704/500

(Continued)

*Primary Examiner* — Christian M Dorman
(74) *Attorney, Agent, or Firm* — Blank Rome LLP

(57) ABSTRACT

Systems, methods, and computer readable media are described for effectively using dither techniques upon signals having a predicted quantization error that varies across the range of the signal. In some embodiments, predicted error is used to shape a precision input signal so that the newly-shaped signal yields a uniform or relatively uniform predicted quantization error. A dither is applied to the re-shaped signal, and the shaping is reversed, after which the signal may be slope limited and/or quantized, taking full and efficient advantage of the dithering technique.

20 Claims, 14 Drawing Sheets

(51) Int. Cl.
*H04N 19/895* (2014.01)
*G09G 3/20* (2006.01)
*H04N 19/60* (2014.01)
*H04N 19/12* (2014.01)
*H04N 19/18* (2014.01)
*H04N 19/85* (2014.01)
*G11B 20/10* (2006.01)
*G10L 19/26* (2013.01)
*G10L 19/005* (2013.01)
*H04N 1/56* (2006.01)
*G06T 3/40* (2006.01)
*G06T 3/20* (2006.01)
*H04B 1/7085* (2011.01)
*H04N 1/58* (2006.01)
*H04N 19/124* (2014.01)
*H04N 19/36* (2014.01)

(52) U.S. Cl.
CPC ............ *G10L 19/26* (2013.01); *G11B 20/10* (2013.01); *G11B 20/10009* (2013.01); *G11B 20/10018* (2013.01); *G11B 20/10037* (2013.01); *G11B 20/10527* (2013.01); *H03M 13/251* (2013.01); *H03M 13/612* (2013.01); *H04B 2001/70855* (2013.01); *H04N 1/56* (2013.01); *H04N 1/58* (2013.01); *H04N 19/124* (2014.11); *H04N 19/36* (2014.11)

(56) References Cited

U.S. PATENT DOCUMENTS

2016/0042744 A1* 2/2016 Klejsa ................... G10L 19/035
                                                                    704/230
2017/0076431 A1* 3/2017 Dai ......................... G06T 5/002

* cited by examiner

| 370 APPLICATION A | 371 PHOTOS | 372 QUICKEN | 373 IMOVIE | 374 APPLICATION B | 375 |
| 360 OTHER APPLICATION SERVICES | 361 SPRITE KIT | 362 SCENE KIT | 363 CORE ANIMATION | 364 CORE GRAPHICS | 380 |
| 350 O/S SERVICES | 351 OPENGL | 352 METAL | 353 SOFTWARE RAYTRACER | 354 SOFTWARE RASTERIZER | 385 |
| O/S KERNEL 345 | | | | | 390 |
| HARDWARE 340 | | | | | 395 |

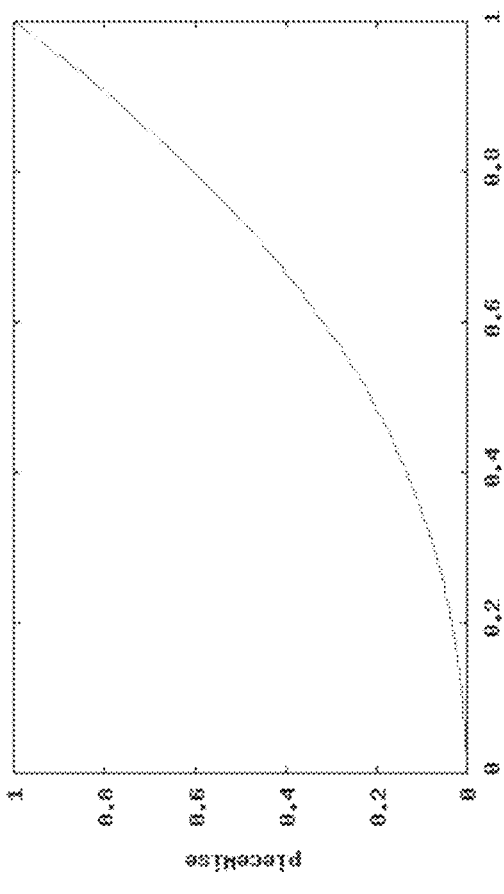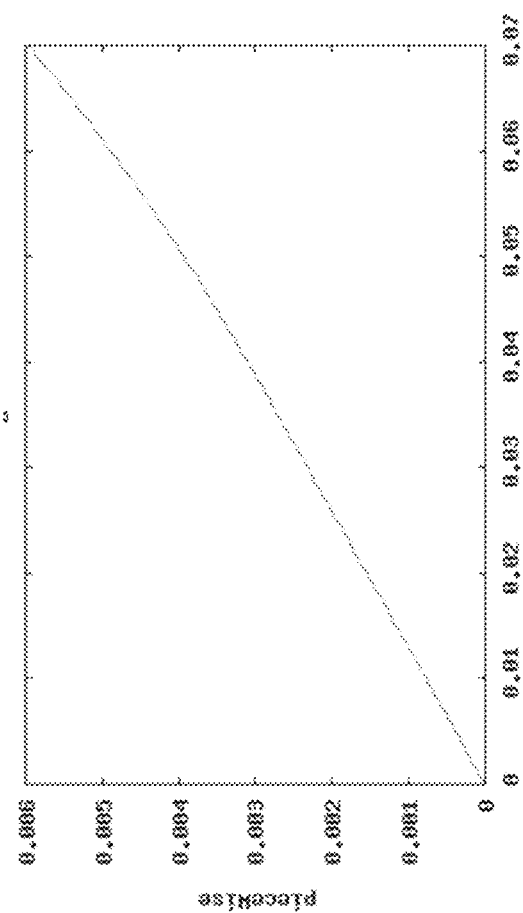

```
pieceWiseGamma : 2.4$
pieceWiseA : 0.9479$
pieceWiseB : 0.0521$
pieceWiseC : 0.0774$
pieceWiseD : 0.0393$
pieceWise(x) := if (x < pieceWiseD) then (pieceWiseC * x) else (pieceWiseA * x + pieceWiseB)^pieceWiseGamma$
wxplot2d(pieceWise, [x, 0,0.07]); wxplot2d(pieceWise, [x, 0,01.0]);
```

FIG. 7

SYSTEM AND METHOD FOR IMPROVING GRAPHICS AND OTHER SIGNAL RESULTS THROUGH SIGNAL TRANSFORMATION AND APPLICATION OF DITHERING

CROSS-REFERENCE TO RELATED APPLICATIONS

This application claims priority to U.S. Provisional Patent Application 62/234,520, entitled SYSTEM AND METHOD FOR IMPROVING GRAPHICS AND OTHER SIGNAL RESULTS THROUGH SIGNAL TRANSFORMATION AND APPLICATION OF DITHERING, filed Sep. 29, 2015, which is incorporated by reference herein in its entirety.

BACKGROUND

The inventions disclosed herein relate to the field of signal processing, and by way of example, graphics processing and audio processing in a computerized environment.

The increase in computing capacity and related technologies often facilitates a situation where precision signals may be represented digitally in a system, while the output of the system is physically unable to natively reproduce the original precision level (e.g., signal quality) for output, storage, or transmission. For example, computers may hold audio and video encoded at much higher quality levels than the available audio and graphics systems can reproduce or transmit for the user. In these cases, technology may be employed to intelligently reduce the precision of the original signal so that the output (e.g., media) encoded in the signal can be reproduced in the most precise or perceptually pleasing manner within the limits of the output system.

In a particular example relating to audio, contemporary soundcards can record audio at 24-bit resolution (i.e., bits per sample) or above and using sample rates of 96 kHz. However, if it is desired to use an audio CD, the audio will likely be encoded at a 16-bit resolution with only 44.1 kHz sampling. Therefore, in order to represent the 24/96 audio on a 16/44.1 system, there must be conversion where information is literally lost. The situation is similar with respect to graphics where a pixel of media may be represented in X bits while the reproduction system (in one respect or another) can only handle X-Y bits per pixel. These types of problems occur more frequently as the abilities of networks and computers increase to allow for the creation, transmission and storing of high precision signals, such as high dynamic range (HDR) and oversampled media.

SUMMARY

In one particular example of an embodiment of this disclosure, high precision HDR signals, or standard dynamic range (SDR) signals with good blacks, may be represented in fewer bits (to save space in media representation, or to save bandwidth in transmission), and may be processed in software or hardware using fewer bits yielding higher quality results (no sacrifice of black values; no high noise) requiring less power, fewer computation cycles, or fewer gates to implement. This may be accomplished, in some embodiments, by a specialized application of dithering. In particular, in some embodiments, a precision signal is evaluated to predict the error of quantization for the particular use of the precision signal. In these embodiments, the predicted error may be used to form an error-based transform for the original precision signal. By applying the error-based transform to the precision signal, the nature of the quantization error (transformed precision signal compared to quantized version of the original precision signal) is changed such that the error is uniform or relatively uniform (in a magnitude band or threshold-limited magnitude band) across the range of the precision signal. After the error-based transformation, a stochastic dither may be more effectively applied to the transformed precision signal because dithering is more effective on systems with uniform quantization error. After the application of dithering, the error-based transform may be reversed, thus preparing the signal for further processing including, for example, quantization or slope limiting and truncation or rounding.

This disclosure relates generally to the field of signal processing, and more particularly, but not by way of limitation, to processing graphics and audio signals in a computing system.

BRIEF DESCRIPTION OF THE DRAWINGS

FIG. 3 shows an illustrative software layer and architecture diagram.

FIGS. 6A and 6B show an illustrative piecewise function and a portion thereof.

FIG. 7 shows illustrative code for the plots in FIGS. 6A and 6B.

DETAILED DESCRIPTION

Figure 1:
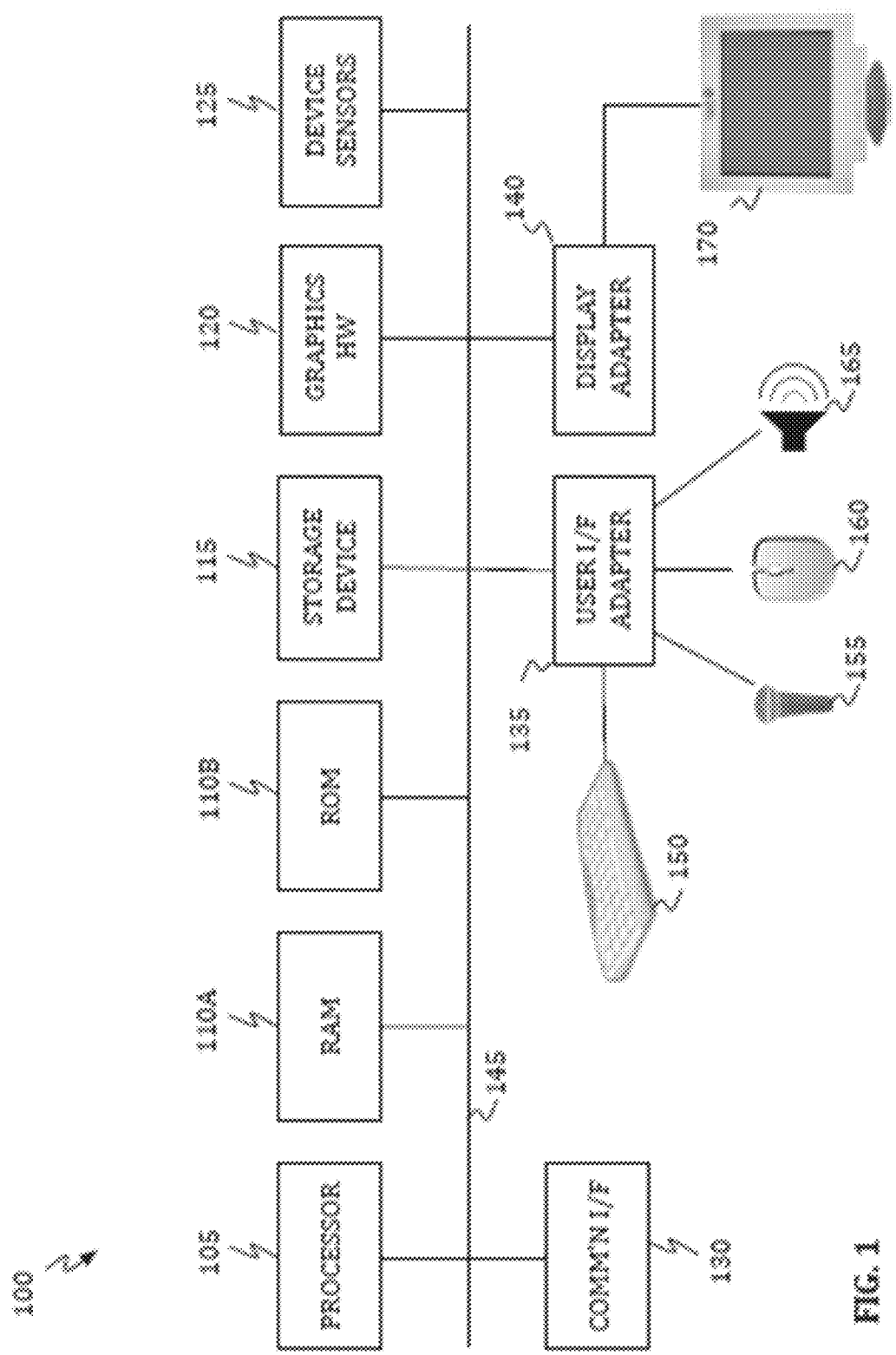
FIG. 1 shows a representative computer node that may be used, for example, as an end-user machine or a developer machine.

This disclosure pertains to systems, methods, and computer readable media to improve the operation of computer systems, including the output of media (e.g., audio and/or video) through graphics and audio systems. It also pertains to a variety of architectures for design and/or operation of computer-based signal processing to improve audio, graphics, or other system signals, where the capability of the output system is insufficient to reproduce the full precision of a signal held, produced, or received by the computer system.

In the following description, for purposes of explanation, numerous specific details are set forth in order to provide a thorough understanding of the disclosed concepts. As part of this description, some of this disclosure's drawings represent structures and devices in block diagram form in order to avoid obscuring the novel aspects of the disclosed concepts. In the interest of clarity, not all features of an actual implementation are described. Moreover, the language used in this disclosure has been principally selected for readability and instructional purposes, and may not have been selected to delineate or circumscribe the inventive subject matter, leaving resorting to the claims as a potential necessity to determine such inventive subject matter. Reference in this disclosure to "one embodiment" or to "an embodiment" or "embodiments" means that a particular feature, structure, or characteristic described in connection with the embodiment is included in at least one embodiment of the disclosed subject matter, and multiple references to "'one embodiment" or "an embodiment" should not be understood as necessarily all referring to the same embodiment. Furthermore, references to an invention or the invention are not intended to limit the disclosed subject matter to any particular technique or structure or any group of techniques or structure.

It will be appreciated that in the development of any actual implementation (as in any software and/or hardware development project), numerous decisions must be made to achieve the developers' specific goals (e.g., compliance with system- and business-related constraints), and that these goals may vary from one implementation to another. It will also be appreciated that such development efforts might be complex and time-consuming, but would nonetheless be a routine undertaking for those having the benefit of this disclosure and being of ordinary skill in signal processing areas including without limitations technologies such as graphics and/or audio processing.

Exemplary Hardware and Software

The inventive embodiments described herein may have implication and use in and with respect to all types of devices, including single- and multi-processor computing systems and vertical devices (e.g., cameras, gaming systems, appliances, etc.) that incorporate single- or multi-processing computing systems. The discussion herein is made with reference to a common computing configuration that may be discussed as a software development system, an end user system, a server, or any other system with responsibility or partial responsibility for deploying information stored in a source signal through a hardware and/or software arrangement that supports the level of precision represented in the source signal. The discussion is only for illustrations regarding sample embodiments are not intended to confine the application of the invention to the disclosed hardware. Other systems having other known or common hardware configurations (now or in the future) are fully contemplated and expected. With that caveat, a typical hardware and software operating environment is discussed below. The hardware configuration may be found, for example, in a server, a workstation, a laptop, a tablet, a desktop computer, a gaming platform (whether or not portable), a television, an entertainment system, a smart phone, a phone, a wearable device, a vehicle, an embedded device, or any other computing device, whether mobile or stationary. Furthermore, for the purpose of signal processing, the responsibility may be shared among multiple systems such as a server and an end-user device.

Referring to FIG. 1, the disclosed embodiments may be performed by representative computer system 100. For example the representative computer system may act as a software development platform, a server, or an end-user device. System 100 may be embodied in any type of device, such as a general purpose computer system, a television, a set top box, a media player, a multi-media entertainment system, an image processing workstation, a hand-held device, or any device that may be coupled with or may incorporate audio/video output or presentation devices as discussed herein. Computer system 100 may include one or more processors 105, memory 110 (110A and 110B), one or more storage devices 115, and graphics hardware 120.

Computer system 100 may also have device sensors 125, which may include one or more of: depth sensors (such as a depth camera), 3D depth sensor(s), imaging devices (such as a fixed and/or video-capable image capture unit), RGB sensors, proximity sensors, ambient light sensors, accelerometers, gyroscopes, any type of still or video camera, LIDAR devices, SONAR devices, microphones, CCDs (or other image sensors), infrared sensors, thermometers, etc. These and other sensors may work in combination with one or more graphics processing units (GPUs), digital signal processors (DSPs), or conventional microprocessors along with appropriate programming so the sensor outputs may be properly embodied in a digital signal, interpreted, and/or combined and interpreted.

Returning to FIG. 1, system 100 may also include communication interface 130, user interface adapter 135, and display adapter 140—all of which may be coupled via system bus or backplane 145. Memory 110 may include one or more different types of media (e.g., solid-state, DRAM, optical, magnetic, etc.) used by processor 105 and graphics hardware 120. For example, memory 110 may include memory cache, read-only memory (ROM), and/or random access memory (RAM). Storage 115 may include one or more non-transitory storage media including, for example, magnetic disks (fixed, floppy, and removable) and tape, optical media, such as CD-ROMs and digital video disks (DVDs), and semiconductor memory devices, such as Electrically Programmable Read-Only Memory (EPROM), and Electrically Erasable Programmable Read-Only Memory (EEPROM). Memory 110 and storage 115 may be used to retain media (e.g., audio, image, and video files), preference information, device profile information, computer program instructions organized into one or more modules and written in any desired computer programming language, and any other suitable data. When executed by processor 105 and/or graphics hardware 120, such computer program code may implement one or more of the methods or processes described herein. Communication interface 130 may include semiconductor-based circuits and may be used to connect computer system 100 to one or more networks. Illustrative networks include, but are not limited to: a local network, such as a USB network; a business's local area network; and a wide area network, such as the Internet; and may use any suitable technology (e.g., wired or wireless). Communications technologies that may be implemented include cell-based communications (e.g., LTE, CDMA, GSM, HSDPA, etc.) or other communications (Ethernet, WiFi, Bluetooth, USB, Thunderbolt, Firewire, etc.). User interface adapter 135 may be used to connect keyboard 150, microphone 155, pointer device 160, speaker 165, and other user interface devices, such as a touchpad and/or a touch screen (not shown). Display adapter 140 may be used to connect one or more display units 170.

Processor 105 may execute instructions necessary to carry out or control the operation of many functions performed by system 100 (e.g., evaluation, transformation, signal processing, and compilation and/or rendering of graphics and graphics programs). Processor 105 may, for instance, drive display 170 and receive user input from user interface adapter 135 or any other user interfaces embodied by a system. User interface 135, for example, can take a variety of forms, such as a button, a keypad, a dial, a click wheel, a keyboard, a display screen, and/or a touch screen. Processor 105 may be any type of computing device such as one or more microprocessors working alone or in combination with GPUs, DSPs, custom signal processing hardware, or system-on-chip devices, such as those found in mobile devices. Processor 105 may include one or more dedicated GPUs or graphics subsystems that accept program instructions to create or alter display information, such as pixels. In addition, processor 105 may be based on reduced instruction-set computer (RISC) or complex instruction-set computer (CISC) architectures or any other suitable architecture and may include one or more processing cores. Graphics hardware 120 may be special purpose computational hardware for processing graphics and/or assisting processor 105 in performing computational tasks. In some embodiments, graphics hardware 120 may include CPU-integrated graphics and/or one or more programmable GPUs. System 100 (implementing one or more embodiments discussed herein) can provide the means for one or more users to control the same system (e.g., system 100) or another system (e.g., another computer or entertainment system) through user activity, which may include natural activity and/or predetermined gestures, such as hand gestures.

Various embodiments of the invention may employ sensors, such as cameras. Cameras and similar sensor systems may include auto-focus systems to accurately capture video or image data ultimately used to interpret user intent or commands. Since the motion of the user may be based upon subtle activity in small regions in the captured images (e.g., hands, fingers, face, mouth, brow, etc.) the autofocus system may be used to separately focus on multiple regions of the image in order to access better information. Any real world information (e.g., analog) captured or held by the system may be processed using one or more of custom circuitry, one or more DSPs, one or more central processing units (CPUs) and/or one or more GPUs.

Returning again to FIG. 1, sensors 125 may capture contextual and/or environmental phenomena such as time; location information; the status of the device with respect to light, gravity, and the magnetic north; and even still and video images. In addition, network-accessible information, such as weather information, may also be used as part of the context. All captured contextual and environmental phenomena may be used to provide context to user activity or information about user activity. For example, in accessing a gesture or the expression or emotion of a user, the contextual information may be used as part of the analysis. If the time is 3:00 a.m., it is more likely that a user's face indicates sleepiness than sadness.

Output from the sensors 125 may be processed, at least in part, by processors 105 and/or graphics hardware 120 and/or a dedicated image processing unit incorporated within or without system 100, and/or one or more DSP or custom signal processing arrangements. Information so captured may be stored in memory 110 and/or storage 115 and/or any storage accessible on an attached network. Memory 110 may include one or more different types of media used by processor 105, graphics hardware 120, and sensors 125 to perform device functions. Storage 115 may store data such as media (e.g., audio, image, and video files); metadata for media; computer program instructions; and other software, including database applications (e.g., a database storing avatar frames), preference information, device profile information, and any other suitable data. Memory 110 and storage 115 may be used to retain computer program instructions or code organized into one or more modules in either compiled form or written in any desired computer programming language. When executed by, for example, processor 105 (e.g., GPU or DSP), such computer program code may implement one or more of the acts or functions described herein (e.g., processing signals, such as audio or graphics signals).

Figure 2:
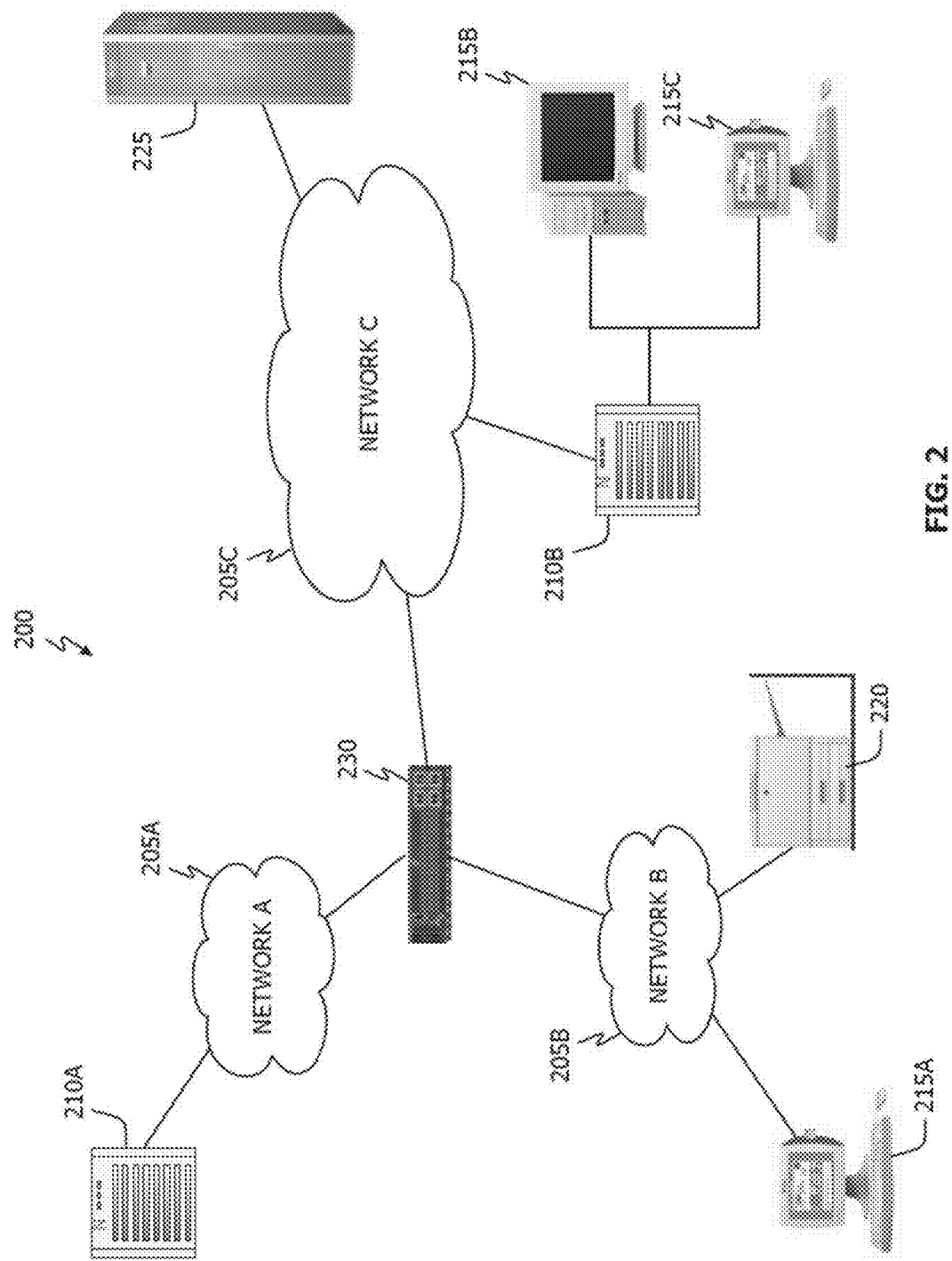
FIG. 2 shows an illustrative network environment associated with embodiments of the invention.

FIG. 2 depicts illustrative network architecture 200, within which the disclosed techniques may be implemented and the disclosed hardware may reside. This illustrative network 200 may include a plurality of networks 205, (i.e., 205A, 205B, and 205C), each of which may take any form including, but not limited to, a local area network (LAN) or a wide area network (WAN), such as the Internet. Further, networks 205 may use any desired technology (wired, wireless, or a combination thereof) and protocol (e.g., transmission control protocol, TCP). Coupled to networks 205 are data server computers 210 (i.e., 210A and 210B) that are capable of operating server applications, such as databases, and are also capable of communicating over networks 205. One embodiment using server computers may involve the operation of one or more central systems to process or partially process graphics or audio information (e.g., signal processing) and distribute the processed information to nodes on a network.

Client computers 215 (i.e., 215A, 215B, and 215C), which may take the form of any smartphone, wearable device, vehicle, gaming system, tablet, computer, set top box, entertainment device/system, television, telephone, communications device, or intelligent machine, including embedded systems, may also be coupled to networks 205 and/or data server computers 210. In some embodiments, network architecture 200 may also include network printers, such as printer 220, and storage systems, such as 225, which may be used to store multi-media items or other data referenced herein. To facilitate communication between different network devices (e.g., data servers 210, end-user computers 215, network printer 220, and storage system 225), at least one gateway or router 230 may be optionally coupled therebetween. Furthermore, in order to facilitate such communication, each device employing the network may comprise a network adapter circuit and related software. For example, if an Ethernet network is desired for communication, each participating device must have an Ethernet adapter or embedded Ethernet-capable ICs. Further, the devices may carry network adapters for any network in which they might participate (including, but not limited to, PANs, LANs, WANs, and cellular networks).

As noted above, embodiments of the inventions disclosed herein include software. As such, a description of common computing software architecture is provided as expressed in a layer diagram in FIG. 3. Like the hardware examples, the software architecture discussed here is not intended to be exclusive in any way, but rather to be illustrative. This is especially true for layer-type diagrams, which software developers tend to express in somewhat differing ways. In this case, the description begins with layers starting with the base hardware layer 395, illustrating hardware 340, which may include CPUs, GPUs, DSPs, or other processing and/or computer hardware (whether custom or generally programmable). Above the hardware layer is the operating system (O/S) kernel layer 390, showing an example as O/S kernel 345, which is kernel software that may perform memory management, device management, and system calls (often the purview of hardware drivers). The notation employed here is generally intended to imply that software elements shown in a layer use resources from the layers below and provide services to layers above. However, in practice, all components of a particular software element may not behave entirely in that manner.

Returning to FIG. 3, layer 385 is the O/S services layer exemplified by O/S services 350. O/S services may provide core O/S functions in a protected environment. In addition, O/S services 350 shown in layer 385 may include frameworks for OpenGL 351, Metal 352, Software Raytracer 353, and a Pure Software Rasterizer 354. These particular examples all relate to graphics and/or graphics libraries and are chosen to illuminate sample topics of sample embodiments herein that relate to audio and/or graphics handling. These particular examples also represent graphics frameworks/libraries that may operate in the lower tier of frameworks, such that developers may use shading and graphics primitives and/or obtain fairly tightly coupled control over the graphics hardware. In addition, the particular examples named in FIG. 3 may also pass their work product on to hardware or hardware drivers, which may or may not run in the kernel.

Referring again to FIG. 3, OpenGL 351 represents an example of a well-known library and application-programming interface for graphics rendering including 2D and 3D graphics. Metal 352 also represents a published graphics library and framework, but it is lower level than OpenGL 351, supporting fine-grained, low-level control of the organization, processing, and submission of graphics and computation commands, as well as the management of associated data and resources for those commands. Software Raytracer 353 is software for creating image information based upon the process of tracing the path of light through pixels in the plane of an image. Pure Software Rasterizer 354 refers generally to software used to make graphics information, such as pixels, without specialized graphics hardware (e.g., using only the CPU). These libraries or frameworks shown within the O/S services layer 385 are only exemplary and are intended to show the general level of the layer and how it relates to other software in a sample arrangement (e.g., kernel operations usually below and higher-level Applications Services 360 usually above). In addition, it may be useful to note that Metal 352 represents a published framework/library of Apple Inc. that is known to developers in the art. Furthermore, OpenGL 351 may represent a framework/library present in current versions of software distributed by Apple Inc.

Above the O/S services layer 385 is an Application Services layer 380, which includes Sprite Kit 361, Scene Kit 362, Core Animation 363, Core Graphics 364, and other application services 360. The O/S services layer 385 represents higher-level frameworks that are commonly directly accessed by application programs. In some embodiments of this disclosure the O/S services layer 385 includes graphics-related frameworks that are high level in that they are agnostic to the underlying graphics libraries (such as those discussed with respect to layer 385). In such embodiments, these higher-level graphics frameworks are meant to provide developer access to graphics functionality in a more user/developer-friendly way and to allow developers to avoid work with shading and graphics primitives. By way of example, Sprite Kit 361 is a graphics rendering and animation infrastructure made available by Apple Inc. Sprite Kit 361 may be used to animate textured images or "sprites." Scene Kit 362 is a 3D-rendering framework from Apple Inc. that supports the import, manipulation, and rendering of 3D assets at a higher level than frameworks having similar capabilities, such as OpenGL. Core Animation 363 is a graphics rendering and animation infrastructure made available from Apple Inc. Core Animation 363 may be used to animate views and other visual elements of an application. Core Graphics 364 is a two-dimensional drawing engine from Apple Inc. Core Graphics 365 provides 2D rendering for applications.

Above the application services layer 380 is the application layer 375, which may comprise any type of application program. By way of example, FIG. 3 shows three specific applications: Photos 371 (a photo management, editing, and sharing program), Quicken 372 (a financial management program), and iMovie 373 (a movie-making and sharing program). Application layer 375 also shows two generic applications 370 and 374, which represent the presence of any other applications that may interact with or be part of the inventive embodiments disclosed herein. Generally, some embodiments of the disclosure employ and/or interact with applications that produce displayable/viewable content or audio output. For example, some of the signal processing embodiments discussed herein may be downstream from such applications.

In evaluating O/S services layer 385 and applications services layer 380, it may be useful to realize that different frameworks have higher-level or lower-level application program interfaces, even if the frameworks are represented in the same layer of the FIG. 3 diagram. The illustration of FIG. 3 serves to provide a general guideline and to introduce exemplary frameworks that may be discussed later. Furthermore, some embodiments of the invention may imply that frameworks in layer 380 make use of the libraries represented in layer 385. Thus, FIG. 3 provides intellectual reinforcement for these examples. Importantly, FIG. 3 is not intended to limit the types of frameworks or libraries that may be used in any particular way or in any particular embodiment. Generally, many embodiments of this disclosure propose software activity and architecture in the layers between the hardware 395 and application 375 layers, shown by C100. In particular, some of the signal processing functionality discussed herein may occur in drivers or low-level software in layers 385 or 390, which the signal processing capabilities may access directly or through APIs used in the higher levels 380 and 375.

Conceptual Operations

Slope-limited approximations are commonly used to limit the precision necessary to represent precise functions in linear space, such as naturally occurring functions in linear space or a gamma function in linear space. By way of example, a gamma function usually corresponds to an attribute of human perception. When a precision signal is moved into perceptual space, it may be represented with less information (e.g., fewer bits) because there should not be perceptually redundant codes (i.e., the gamma function may use more codes in an area of higher human perception and fewer codes in an area of lower human perception). Thus, the transition to gamma space implements a type of compression. Typically, one goal is to select codes that are as perceptually relevant as possible: in areas where human perception is greater, codes may be placed nearer to each other; and in areas where human perception is weaker, the codes may be placed more sparsely. One real-world example occurs in a human's perception of colors, such as levels of black, which occurs because the human eye is more sensitive to gradations of darker regions (e.g., black, etc.) than to gradations of brighter regions (e.g., white, etc.). Due to this difference in sensitivity, it may, in some scenarios, be more efficient to control the gamma function using a scale that mimics human perception. This may, for example, include using more codes for the gamma function in an area of higher human perception (e.g., black regions, etc.) and fewer codes in an area of lower human perception (e.g., white regions, regions that are brighter than black regions, etc.).

In practical computing environments, when it is time to operate on the data, there is a transition from a perceptual space to a linear space (e.g., moving the codes into a linear space). However, the representation of the data in linear space is far more resource demanding, which may effectively reverse the compression provide by the perceptual encoding. For example, ten bits of information in a perceptual space may translate to 27-31 bits or more in linear space. For this example, the translation may depend on the transfer function of the perceptual space. This is because the linear requirements are approximately the bit precision of the encoded input signal multiplied by the input signal's gamma exponent. In the computing environment, often the hardware and/or software lacks capability to operate at the level of precision that may be reflected in the perceptual space. In addition, even if the software and hardware have sufficient capability, a direct translation of the precision may be undesirably computationally expensive. Thus, in either case, before or during translation to linear space, there may be a desire to intelligently limit the precision (e.g., slope limiting) to reduce the burden on the linear space representation. For example, slope limiting the transfer function near zero may assist with significantly reducing the linear precision requirements. In some embodiments of this disclosure, the overall signal processing system design is based upon an assumption that the result will be best if the precision signal is intelligently limited prior to its submission to a hardware or software system that cannot or will not handle the full level of precision. In other words, those embodiments seek to limit the precision of the signal so that the hardware or software limitations are not forcibly imposed during processing. Of course, in some embodiments, the limits placed upon the precision signal will be significant enough to suit the limitations of the hardware or software because any further limitations may unnecessarily diminish the precision level of the result.

Figure 4:
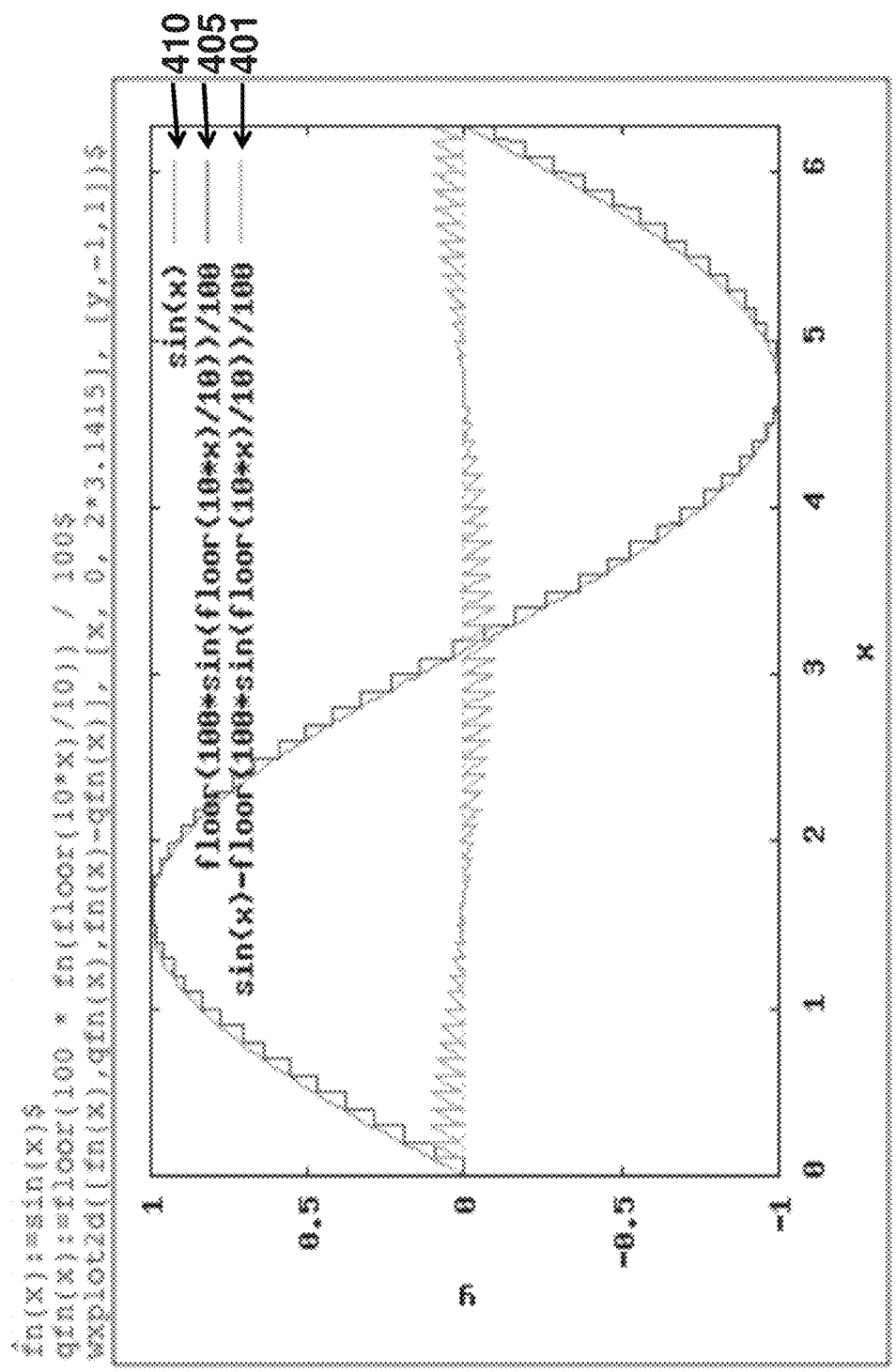
FIG. 4 shows and example of quantization error.

Once a signal has been precision limited (e.g., through slope limiting), a dithering technique is often used to improve the processed result. Dithering is a technique well known in the art, and it is generally used and most effective where the quantization error (e.g., the difference between the precision signal and the precision-limited signal) is evenly distributed across the entire signal range. Thus, in applying dither, a relatively even amount of error is or may be assumed. For example, in graphics, the assumption may be that the error in blacks is relatively the same as the error in the white. With reference to FIG. 4, there is shown a sinusoidal signal 410, a quantization of that signal 405, and an error signal 401, which shows the error between the sinusoid 410 and the quantized sinusoid 405. The illustration is intended to show the relatively uniform error 401, which allows for useful application of dither. However, the illustration also shows that the error varies over a Y domain of about 0.2, so that a more uniform domain of Y for the error may yield better results from dithering.

Figures 5A, 5B:
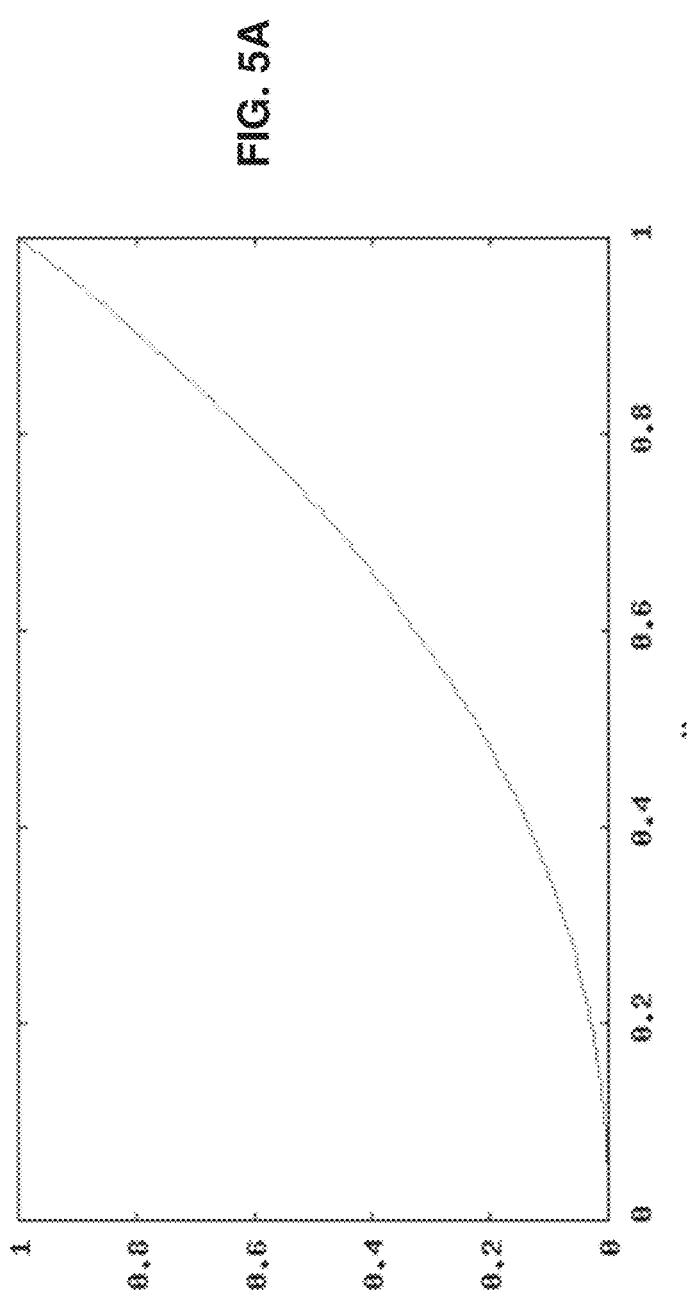
FIGS. 5A and 5B show an illustrative precision signal and associated code.

In some embodiments of this disclosure, there is a recognition (and sometimes detection) that the quantization error may not be even across the entire signal range and that in some instances the error may change dramatically across the range. Thus, some embodiments pre-condition the precision signal to reduce the fluctuation of quantization error and allow for the most beneficial application of dither. One embodiment provides a technique for performing an error-based transform on the precision signal to convert the signal into an equal error space, allowing for the most beneficial application of dither. With reference to FIG. 5A, there is shown an exemplary high precision signal, which is represented as a pure power gamma function called a 2.2 function (as indicated in the source code of FIG. 5B). As evident from the plot, the values for the function near zero are shallow and thusly may require a large amount of information (e.g., many bits) for representation in linear space without aliasing (the sample used in the plot actually shows unintended aliasing). This is because the subtle but non-linear movement of the plot requires many samples to reflect the precision signal with great accuracy. In other words, in order to show the subtle movement of the function near zero, it must be represented in relatively high resolution. In addition, the remainder of the plot of FIG. 5A may be less, but similarly, resource-demanding.

Referring now to FIG. 6A, the plot shown represents a piecewise assembled function to approximate the precision signal of FIG. 5A. In particular, the shallow portion of the plot near zero has been flattened in order to reduce the resolution necessary to represent the plot in linear space. For reference, the plot of FIG. 6B is represented by the following code, which is repeated in FIG. 7 for convenience:

pieceWiseGamma: 2.4$
pieceWiseA: 0.9479$
pieceWiseB: 0.0521$
pieceWiseC: 0.0774$
pieceWiseD: 0.0393$
pieceWise(x):=if (x<pieceWiseD) then (pieceWiseC*x) else (pieceWiseA*x+pieceWiseB)^pieceWiseGamma$ wxplot2d (pieceWise, [x, 0,0.07]); wxplot2d(pieceWise, [x, 0,01.0]);

The plot of FIG. 6B is an excerpt of FIG. 6A and is illustrative of the region of the plot of FIG. 6A near the zero value. As evident, in the piecewise approximation of FIG. 6A, the areas near zero are relatively flat and should convert to linear space without an excessive amount of data to represent the region. The piecewise nature of the plot of FIG. 6B with respect to the plot of FIG. 6A may be seen in the code at FIG. 7 as well as in the visible portion of the X range of the plots in FIGS. 6A and 6B. In particular, the plot of FIG. 6B has an X range starting at zero and extending to 0.07. Examining the plot of FIG. 6A, the flat part of the curve near zero can be seen as reflected in the plot of FIG. 6B, which has an amplified scale on the Y axis that helps with the visualization to see the linearity. Furthermore, in viewing the code of FIG. 7, the nature of the plots is evident in that X values less than 0.0393 yield a value of the function that is different than for other values of X. By separating piecewise portions of a function, a precision-limiting technique (e.g., slope limiting) is implemented as shown.

Figure 8:
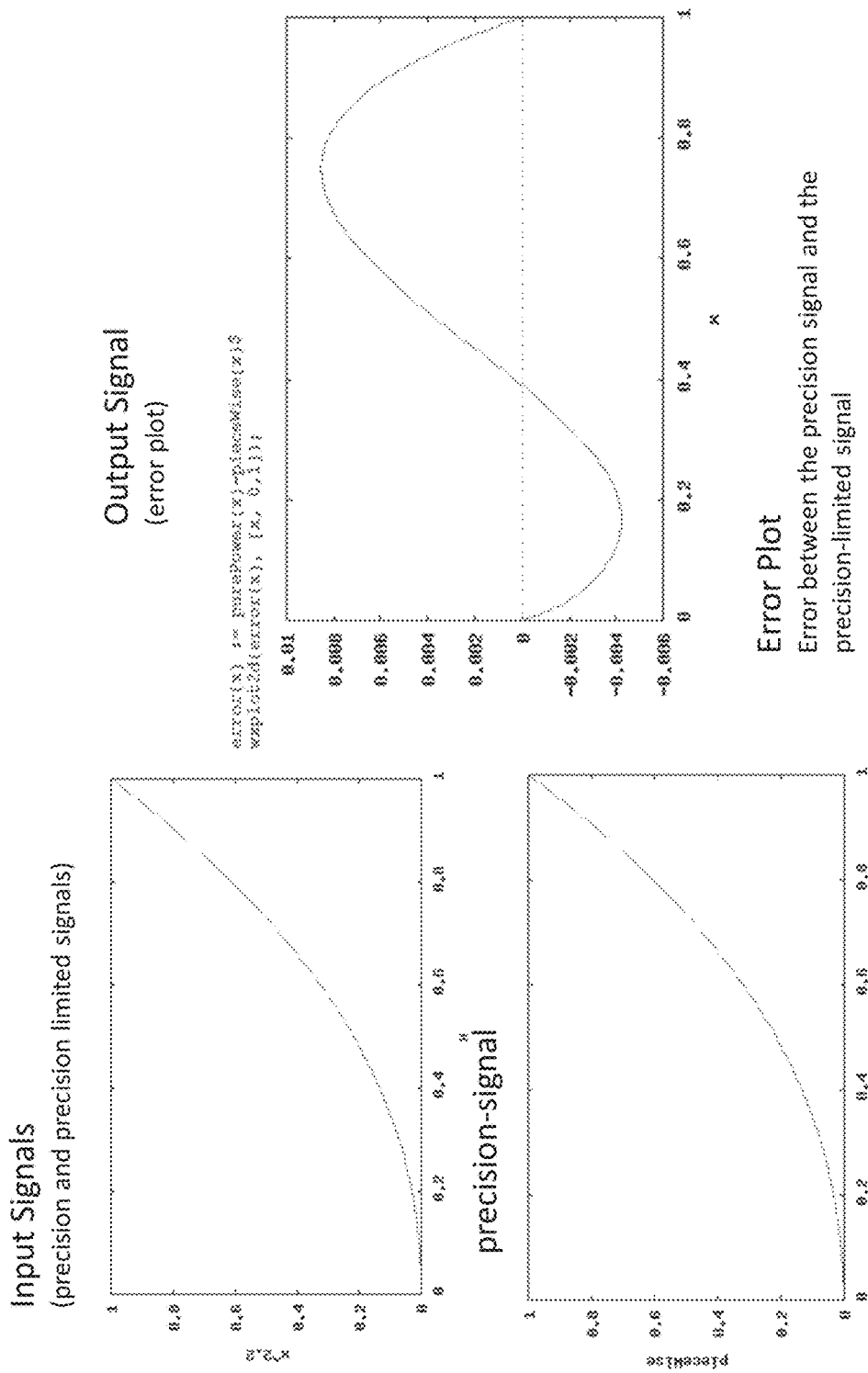
FIG. 8 shows illustrative error information and sample constituent components to the error information.

Referring now to FIG. 8, there is shown an error plot that plots the error (e.g., quantization error) between the precision signal of FIG. 5 (copied as "precision signal" in FIG. 8) and the piecewise precision-limited plot of FIG. 6A (copied as "precision-limited signal" in FIG. 8). As evident in the error plot, the error (and thus the quantization error) varies substantially across the range of the error signal. For example, where the input signals are closer to zero, the error is negative, but as the X value increases, the error turns sharply positive. The illustration of FIG. 8 helps demonstrate why dithering may not be useful for many signals where error (e.g., quantization error) varies substantially across a signal's range. One common example is a gamma function in a graphics system. In particular, because the error is dramatically uneven across the range of the precision-limited signal, any single dithering (e.g., stochastic dithering) technique or magnitude applied may help some sections of the result signal while hurting others.

Figures 9A, 9B:
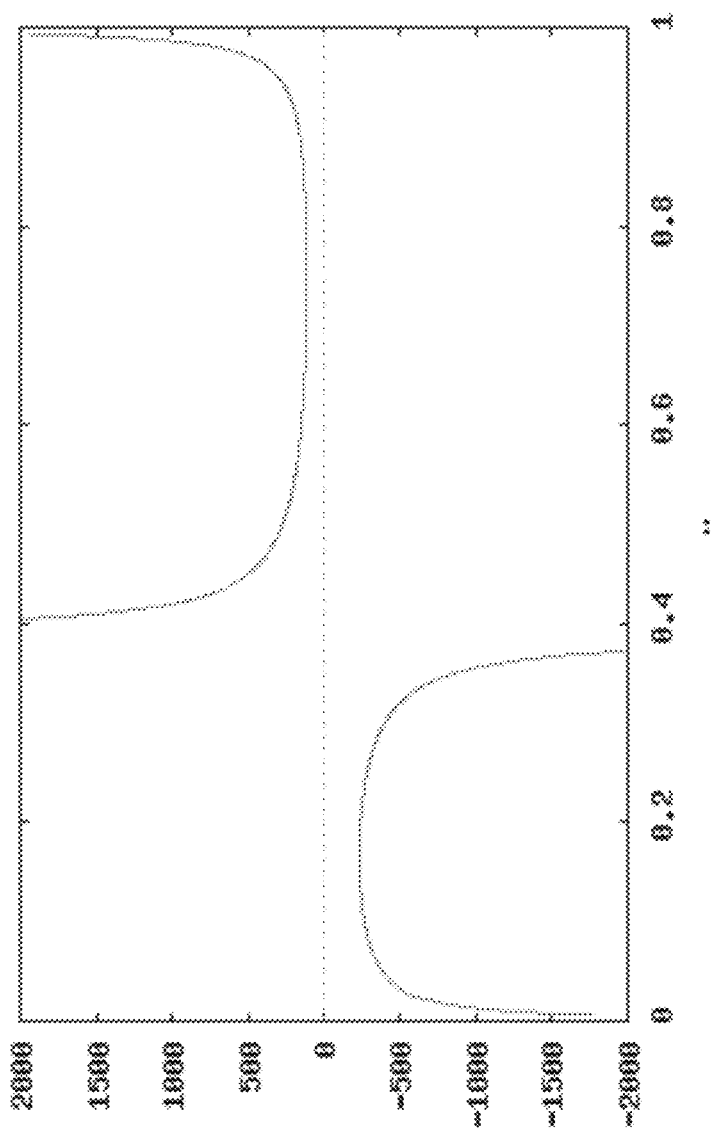
FIGS. 9A and 9B show illustrative inverse error information and related code.
Figure 10:
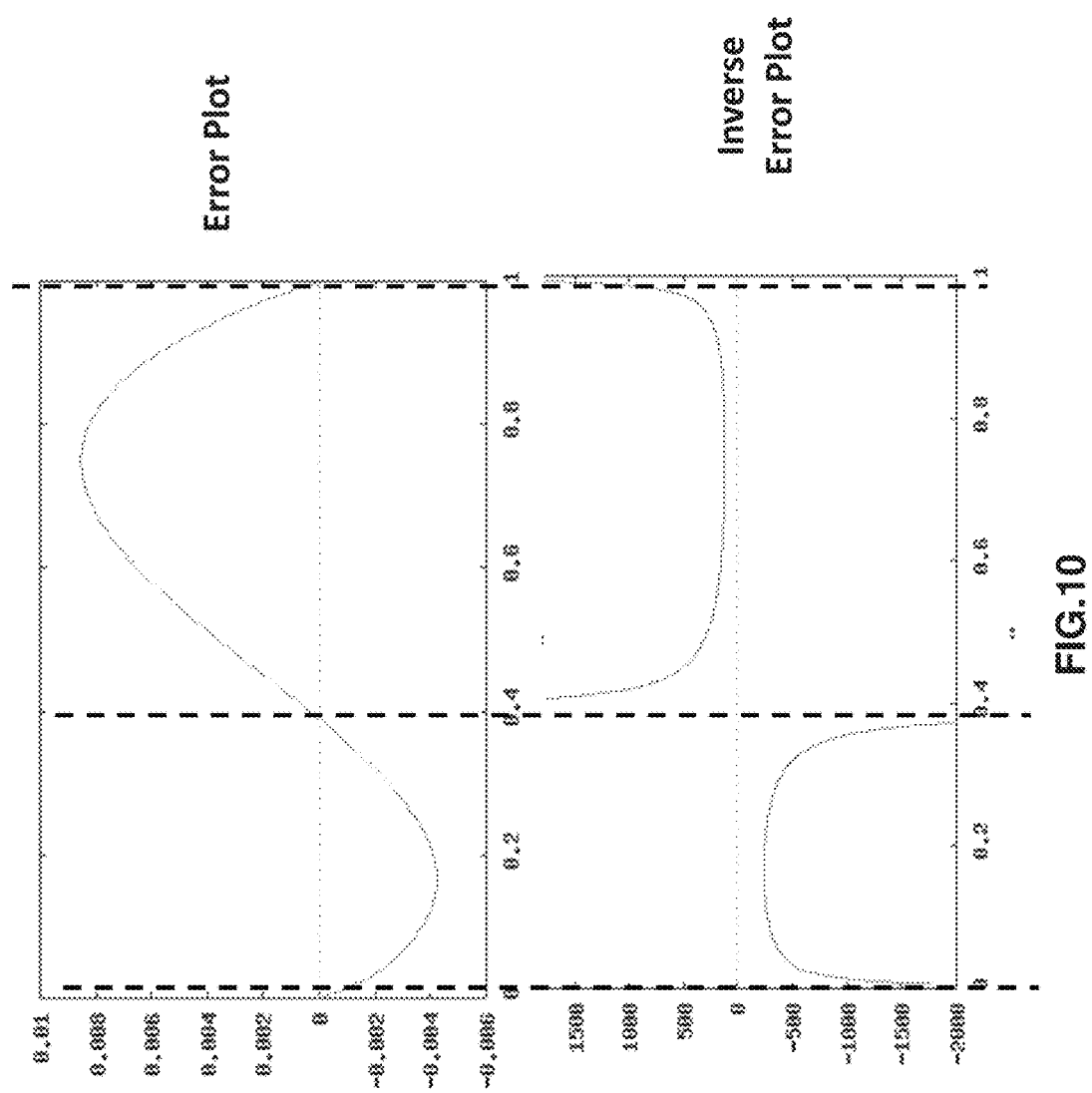
FIG. 10 shows an illustrative inverse error plot juxtaposed with a corresponding illustrative error plot.

Referring now to FIG. 9A, there is shown an inverse error plot, for example plotted according to the code in FIG. 9B. As the code and the plot of FIGS. 9A and 9B indicate, the inverse error plot represents the inverse of the error plot of FIG. 8. Referring now to FIG. 10, there is shown the inverse error plot juxtaposed with the error plot. The dashed lines in FIG. 10 show that when the error is zero, the inverse error goes to an extreme (technically undefined) and otherwise the juxtaposition shows that where the error peaks, the inverse error peaks inversely. In some embodiments, the inverse error may be employed to transform the precision signal such that an error plot (between the transformed precision signal and the precision-limited signal) is more uniform across the range, thus making the transformed signal more amenable to the use of dither. After the precision signal is transformed, a dither may be applied followed by a reverse of the error transform. The result will be a precision signal with appropriately applied dither, so the manipulated precision signal may have precision-limiting techniques applied (e.g., slope limiting and/or quantization).

Figure 11:
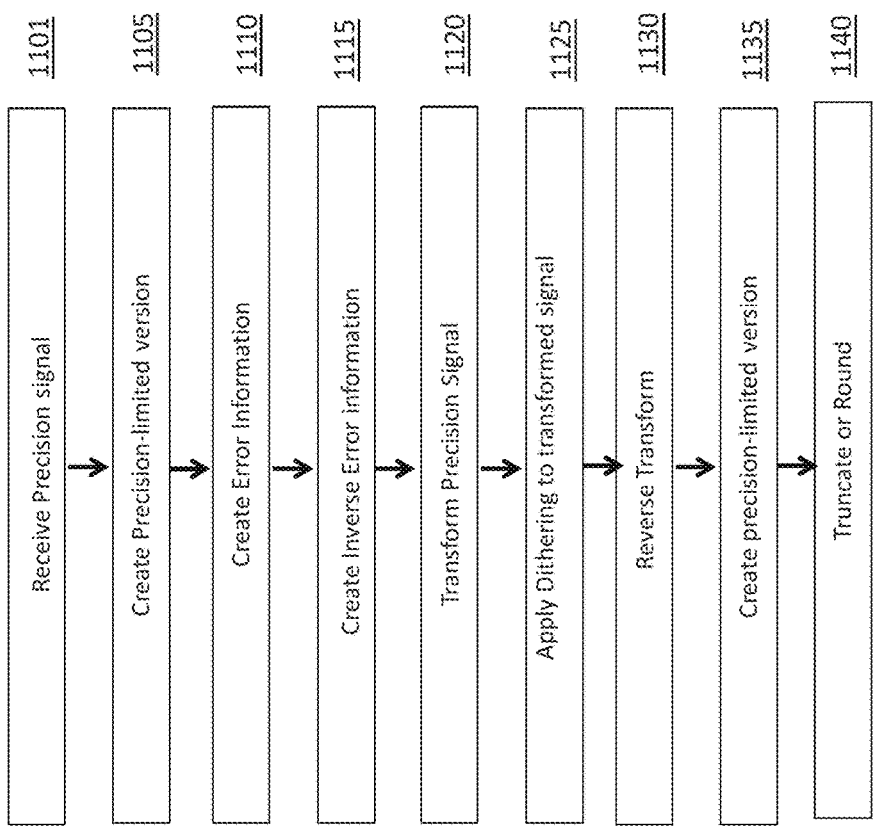
FIG. 11 shows a process associated with certain embodiments of the disclosure.

Referring now to FIG. 11, there is shown a process for appropriately applying dither to a precision signal. At 1101, the process may begin with by receiving a precision signal, typically represented in a memory of an intelligent device, such as any of the devices discussed above. The precision signal may be a highly precise audio, video, AV, or graphics signal, such as a gamma function. Alternatively, the precision signal may be any signal and the reference to "precision" may simply be used to indicate relative precision as compared to a precision-limited (e.g., slope limited) or quantized version of the signal. While the embodiments herein may expressly reference audio and graphics related signals, the techniques are intended to apply to any situation where a precision signal may be slope-limited, quantized, or otherwise transformed to a precision-limited signal.

Referring now to item 1105, the precision signal may be manipulated or transformed into a precision-limited signal. The manipulation or transformation may, in some embodiments, involve reading the precision signal from memory, operating on it, and storing the result as a precision-limited signal. The operations may be accomplished through use of a processing circuitry such as CPU, GPU, DSP, or custom logic. The precision-limited signal may be used not as a result signal, but rather as an intermediary item as explained herein. In some embodiments, the precision signal is transformed to a precision-limited signal through slope limiting techniques or quantization (e.g., sampling and representation as a series of samples). However, other embodiments contemplate the creation of a precision-limited signal by any known manner. In some embodiments, the techniques for achieving a precision-limited signal may be a technique (such as quantization) that would otherwise be applied. Thus, if a 24-bit audio signal is being reduced to a 16-bit signal, then the precision-limited signal of item 1105 may employ the same quantization for this intermediary signal.

Moving to item 1110, error information or an error information plot may be derived by comparing the precision signal with the precision-limited signal. In some embodiments, the mathematics of the derivation will occur in a CPU, but could possibly be performed by a GPU, DSP, or in custom hardware. After deriving the error information, it may be stored in a memory to preserve it for further operations. The error information may take the form of a data series (an amount of error per quantization point), a plot or any other known way to represent data; and it may be stored in ordinary memory types or in a structured database.

In some embodiments, the error information may be normalized using any known technique. Depending upon the situation, the normalization may adjust the minima and maxima to a desired or target level and then proportionally adjust the remainder of the information. In other embodiments, normalization may adjust all the values in the data set proportionally so that the minima and maxima are at the same magnitude. In addition, in some embodiments, normalization is performed by an application programming interface (API) call to a computing resource, such as a framework on a host device.

Referring now to item 1115, inverse error information may be calculated. The operation regarding inverse error information may similarly employ memory and processing devices and may be performed on the normalized or non-normalized version of the error information. In some embodiments, if the non-normalized version of the error information is used, then the inverse error information may be normalized. Like the error signal, inverse error information may by embodied in data, a plot, a database, or by any known mechanism. An illustration/example of inverse data information may be seen in FIG. 9B.

Referring now to item 1120, the precision signal may be transformed using the error information (an "error-transformed" signal). In some embodiments, the transformation of item 1120 is directed at changing the precision signal so that new error information (as derived by comparison to the precision-limited signal) will yield relatively uniformly-distributed error (over the range), so that dithering techniques may be most beneficially applied. As discussed above, the transformation of item 1120 may involve memory and processing resources to read, manipulate, and store data. Furthermore, in some embodiments, the precision signal is transformed using the inverse error signal. Application of the inverse error information to the precision signal may even out the error signal (with respect to the precision-limited signal). As a practical matter, since the relationship between the inverse error and the error is purely mathematical, the transformation of item 1120 may be based directly upon the error signal by simply applying appropriate math. Further, since the error signal is mathematically based upon the precision signal and the precision-limited signal, the transformation of item 1120 may be based upon those signals and appropriate math.

After the precision signal is transformed using the error information to produce an error-transformed signal, a dithering technique may be applied 1125 (again employing memory and processing as described). In some embodiments, the dithering is stochastic noise or other random information combined with the error-transformed precision signal. In one or more embodiments, the magnitude of the dithering information may be varied based upon the expected magnitude of error between the error-transformed precision signal and the precision-limited signal.

After applying the dither to the error-transformed precision signal, at item 1130, the error-based transform of item 1120 may be reversed. In some embodiments, the reversal of the transform simply applies an inverse of the function applied for the original transformation 1120.

After reversal of the error-based transform 1130, a new precision-limited version of the signal may be created at 1135, for example by quantizing the signal, slope-limiting the signal, or otherwise reducing the resolution of the precision information. Finally, at 1140, in some embodiments, the newly created precision-limited signal may be truncated or mathematically rounded. The resulting signal will have an appropriately-applied and usefully-applied dither technique even though the original quantization (i.e., the original precision-limited signal) resulted in an uneven error (which, absent the application of the process of FIG. 10, would have been undesirable and/or ineffective).

Using Lookup Tables (LUTs), Tables, or Equations

In some embodiments of the disclosure, the dither functionality generally may be applied one data sample at a time through the use of a lookup table ("LUT"). A LUT, as contemplated by many embodiments, may be a table where a sample from the precision signal is used as an index into the table to yield a result. In these embodiments, the reference to "sample" is not intended to confine the embodiments to audio/video (AV) signals or any other way. In this respect, the word sample is simply used to refer to a discrete datum that may be evaluated for the application of dither.

In some cases, an input sample will not match a discrete table input, so interpolation may be employed to yield a result from the LUT. In one or more embodiments, an LUT may be series of tables, where the output of one table is used as an index into the second table and so on. In other embodiments, an LUT may be a function or series of functions such that input is converted to an output through application of one or more functions that may be employed on the fly (at the time the sample is taken or submitted) or in advance for a large set of samples. In yet other embodiments, an LUT may refer to a combination of one or more functions and/or one or more tables.

In some embodiments, an ideal LUT has a one to one mapping, meaning that for every possible input value, there is a single value out (which may or may not be mutually exclusive to the input). In a more practical embodiment, the number of table entries may be smaller than the number of potential inputs (i.e., there is not a discrete table input for each potential or possible sample value).

A table type LUT may be constructed for these and some other embodiments by calculating an output value for each of a group of input values. The calculation of output values may follow the general process of FIG. 11. Thus, in some embodiments, an LUT may be used to replace one or more of the process items from FIG. 11, such as the entire process or one or more of the transformations. As a result, certain embodiments employing a LUT provide an ability to: perform a look up on the precision signal (or a processed form thereof); assess the error at that point in the precision signal; perform an error-based-transform of the precision signal at that point to prepare it for application of a dither; apply a dither value, such as a stochastic dither value, at that point; reverse the error-based-transformation at that point; perform a precision limiting operation at that point (e.g., apply a quantization); and truncate or round at the point. In other words, these embodiments provide the application of dither on a sample-by-sample basis. The technique provides an ability, in some embodiments, to shape the application of dither. For example, if there is a region of the precision signal with a high amount of error in the quantization, the discrete application of dither through an LUT allows application of more dither in that region and perhaps less dither in another region of the precision signal having less quantization error. As an illustrative example, with respect to FIG. 4, at X=0, there may be a table entry that calls for dither adjustment in accordance with the maximum positive error (e.g., about 0.1). However, when X=3.5 (or so), there may be a table entry that calls for dither adjustment in accordance with the maximum negative error (about −0.1), and so on.

In some embodiments where dither is discretely applied (e.g., through an LUT process), the dither values may be managed and altered such that the dither value may not dramatically change for precision signal values that are perceptually close together. For example, in the graphics contexts, these embodiments seek to avoid the application of dither on one or more pixels and then the application of no dither on adjacent or near-adjacent pixels. As another example, some embodiments seek to avoid the application of dither on some audio samples and then the application of no dither on adjacent audio samples. The idea for these embodiments is to avoid abrupt perceptual changes so that closely positioned precision signal values do not appear perceptually different. Thus, in some embodiments, in order to determine how much dithering difference is permissible for adjacent or near-adjacent precision signal samples, a perceptual model is used to predict the perceptual impact. For example, a threshold may be used for the maximum dithering difference for samples that are adjacent or are within a given range. The threshold may be a calculated amount that may or may not depend on runtime conditions, so it may vary from sample to sample. In other embodiments, the dither applied to a sample for an entire precision signal or for a range of the precision signal may be locked at a single value or determined according to a formula/function.

Figure 12:
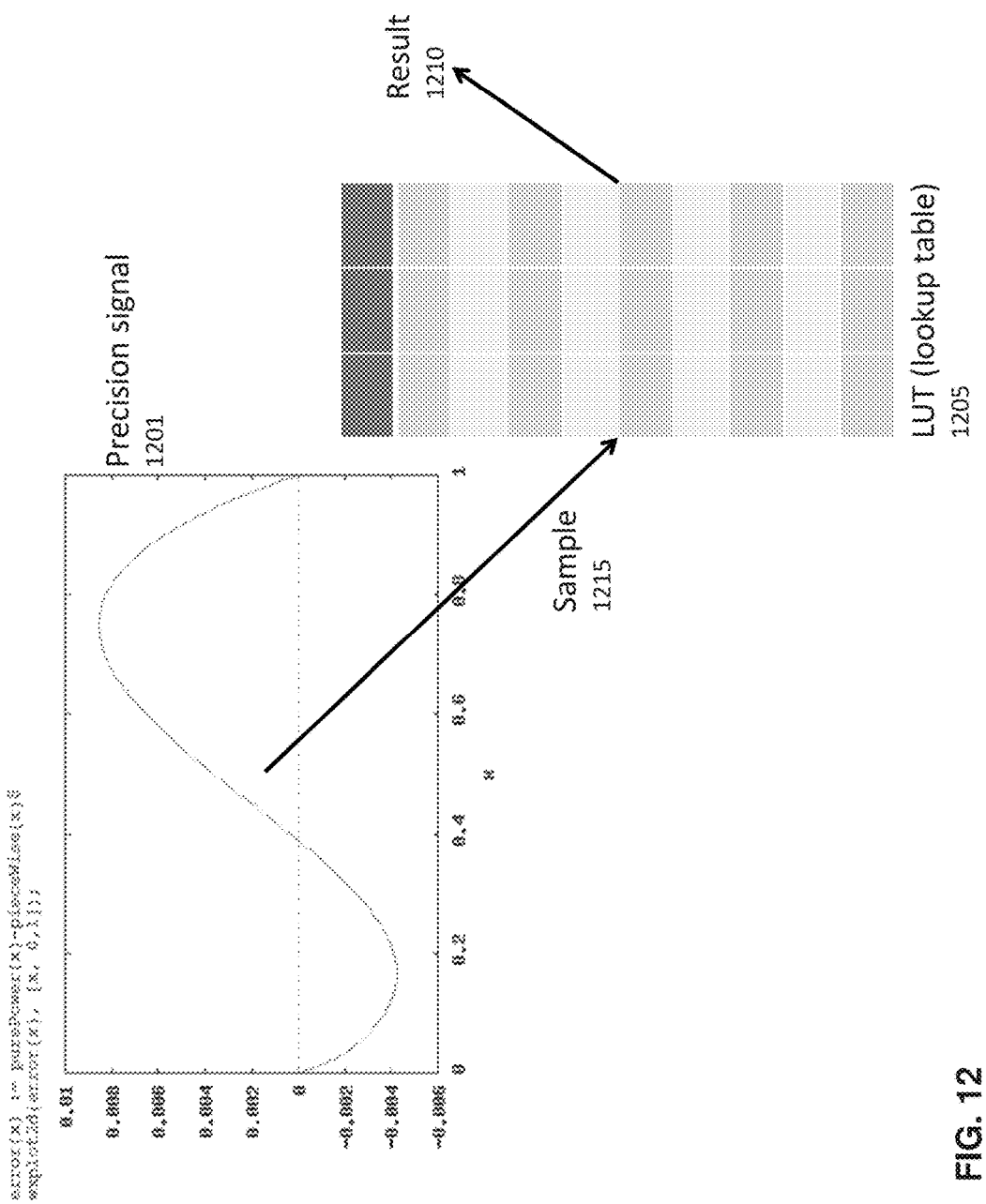
FIGS. 12, 13, and 14 show illustrative lookup tables (LUTs) based embodiments.

Referring now to FIG. 12, an LUT such as LUT 1205 may be implemented using hardware and/or software. In some embodiments, LUT 1205 may be implemented in a database or other memory so that the LUT data may be stored and manipulated and a lookup may be performed upon the LUT. In other embodiments, the LUT may be implemented through a CPU or GPU and software to perform the functions of the LUT. In some instances, LUT output values may be calculated on the fly. In other instances, portions of the LUT may be pre-calculated (e.g., for a particular precision signal, and/or a particular precision-limiting technique etc.)

Referring again to FIG. 12, a sample 1215 contemplates any known sampling technique and the sample may depend upon the nature of the precision signal. For example, in the case of audio, the sample 1215 may be an audio sample, and in the case of video, sample 1215 may be a pixel or fragment. In response to the sample input, LUT 1205 may produce a result 1210 that represents a dither-adjusted version of the precision signal that has been precision-limited (e.g., quantized) and truncated or rounded. In order to achieve this result, the LUT 1205 may implement the process of FIG. 11 or the necessary process items therein. In other embodiments, LUT 1205 may produce a result 1210 that represents only the dithered version of the precision signal and further processing of the sample may occur outside the LUT by hardware or software of the host system. In one or more embodiments, since the LUT applies dithering one sample at a time, the process of FIG. 11 may yield a different dithering value for each sample. These dithering values may be calculated on a per-sample basis according to the process of FIG. 11; alternatively, a dither value may be calculated for bands of dither values (e.g., corresponding to a range of X values rather than a single X value) and also according to the process of FIG. 11 or parts thereof. Furthermore, the output of the LUT 1205 may rely on interpolation. For example, if there are 256 possible LUT input/index values, but only 32 possible actual LUT input values, interpolation may be used to find result 1210 values for inputs that do not correspond to a precise and existing LUT input value (i.e., one of the 32 values). The interpolation may be linear and/or weighted and/or otherwise (e.g., variable dependent).

Figure 13:
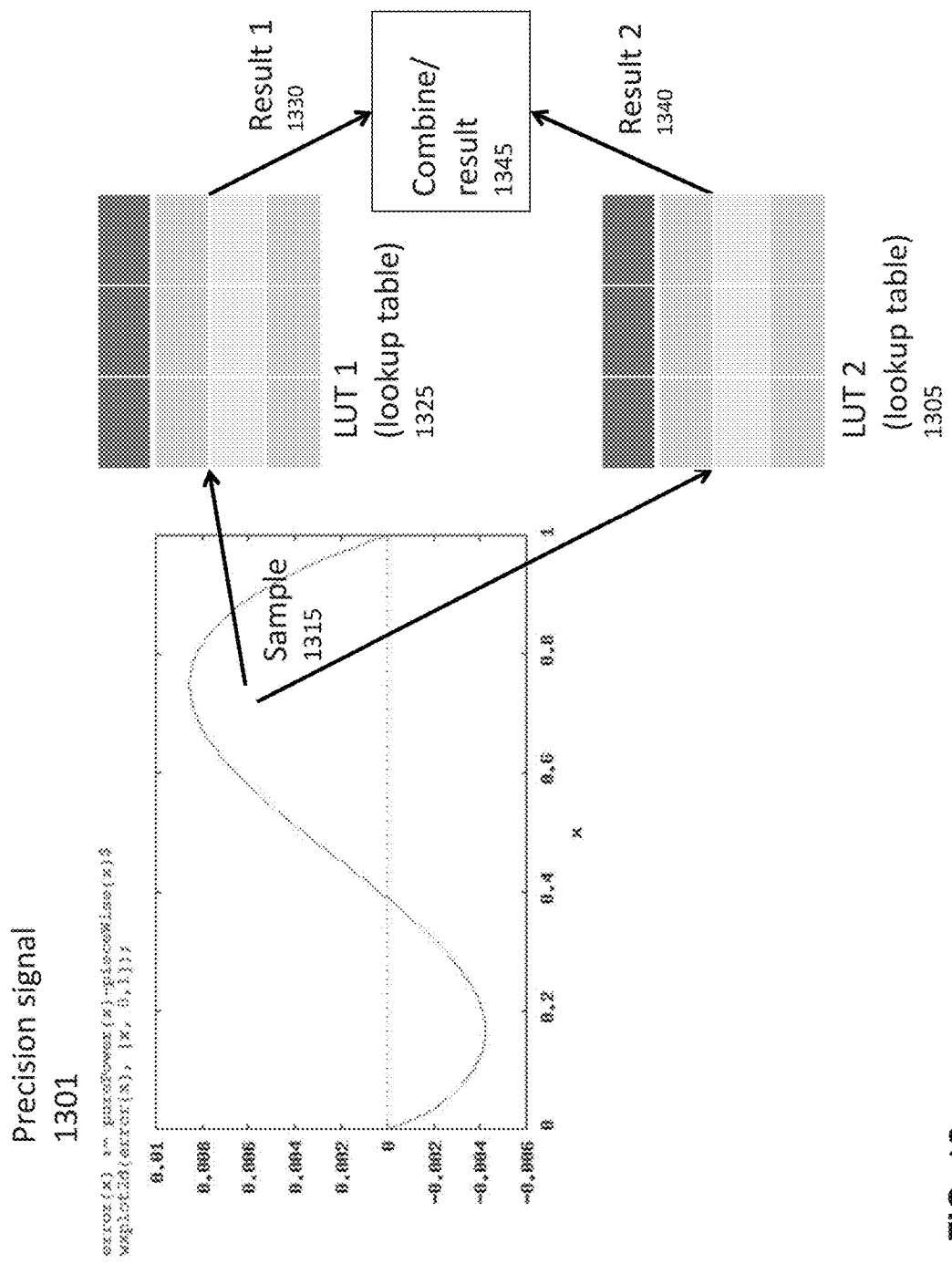

Referring now to FIG. 13, the LUT may employ multiple tables that are accessed in parallel, where each table may be represented by one or more tables or functions or a combination of tables and functions. In FIG. 13, there are shown two LUTs 1325 and 1305 that may, in some embodiments, process the sample in parallel. The results from the tables may be combined by hardware or software 1345 and the combination may include mathematical operations, functions, further use of LUTs, or any combination of the foregoing. In one embodiment, LUT 1 1325 receives a sample 1315 and outputs an error-transformed version of the precision signal, while LUT 2 1305 receives a sample 1315 and outputs a dither value. In that embodiment the two results 1340 and 1330 are combined at hardware/software 1345 to form an appropriately dithered value of the error-transformed precision signal. The sample may then proceed to post processing, which may include one or more of: reversal of the error transformation; precision limiting, such as quantization; and truncation or rounding. The post processing may be performed by further application of LUTs or any known manner.

Figure 14:
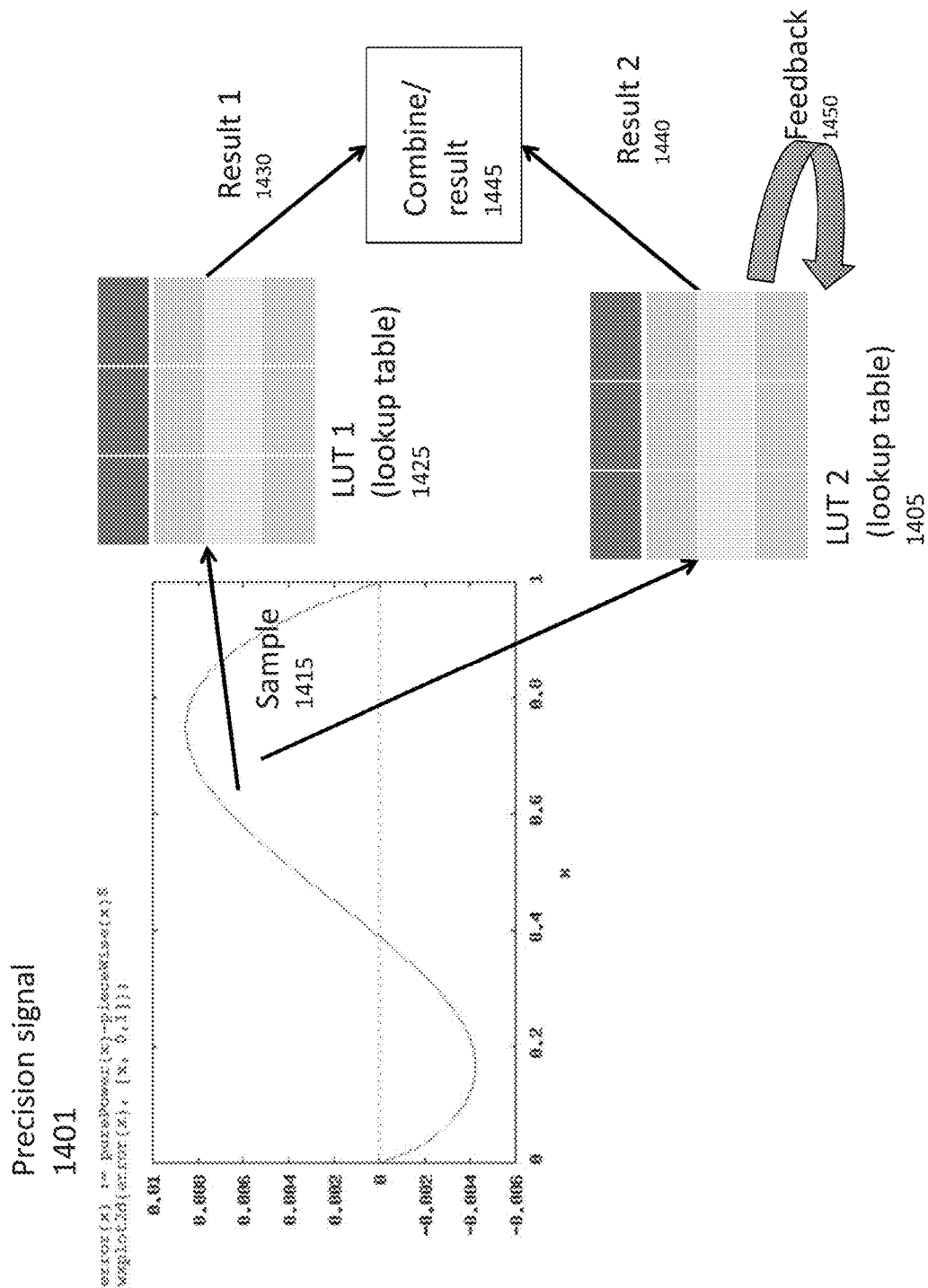

Referring now to FIG. 14, there is shown a dual LUT system similar to the system of FIG. 13. Notably, however, in some embodiments of FIG. 14, feedback loop 1450 indicates that LUT 2 1405 may keep track of dither values assigned to a sample of the precision signal. In some embodiments, the retained dither value sample pairs are used to evaluate the variations in dither between perceptually-close samples of the precision signal. In this manner, these embodiments may prevent the application of dither in a way that creates user-perceivable differences in the overall output (e.g., over time and space).

It is to be understood that the above description is intended to be illustrative, and not restrictive. The material has been presented to enable any person skilled in the art to make and use the invention as claimed and is provided in the context of particular embodiments, variations of which will be readily apparent to those skilled in the art (e.g., many of the disclosed embodiments may be used in combination with each other). In addition, it will be understood that some of the operations identified herein may be performed in different orders. The scope of the invention, therefore, should be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A method for improving signal quality of precision-limited signals, comprising:
   receiving a first precision signal, wherein the first precision signal carries audio and/or video information, and wherein the first precision signal has a first bit resolution;
   determining a second precision-limited signal based upon the first precision signal;
   determining inverse error information based upon a comparison of the first precision signal and the second precision-limited signal, wherein the inverse error information reflects an inverse of an error between the first precision signal and the second precision-limited signal;
   transforming the first precision signal by combining the first precision signal with the inverse error information to form an error-transformed precision signal, wherein the error-transformed precision signal has more uniformly distributed error than the first precision signal;
   applying dithering to the error-transformed precision signal;
   forming a third precision signal by applying a reverse transform to the dithered error-transformed precision signal; and
   creating a fourth precision-limited version of the third precision signal, wherein the fourth precision-limited version of the third precision signal has a second bit resolution, wherein the second bit resolution is lower than the first bit resolution, and wherein the fourth precision-limited version of the third precision signal meets a first quality level target.

2. The method of claim 1, wherein the second precision-limited signal is a quantized version of the first precision signal.

3. The method of claim 1, wherein determining the inverse error information comprises:
   determining error information;
   normalizing the error information; and
   calculating the inverse of the normalized error information.

4. The method of claim 1, wherein the fourth precision-limited version of the third precision signal is created by applying slope limiting.

5. The method of claim 1, wherein the reverse transform is an inverse operation to the transforming of the first precision signal by combining the first precision signal with the inverse error information.

6. The method of claim 1, wherein the dithering includes the use of stochastic noise.

7. The method of claim 1, wherein the first quality level target comprises at least one of: a black level target, or a noise level target.

8. A method for improving signal quality of precision-limited signals, comprising:
   receiving a first precision signal, wherein the first precision signal carries audio and/or video information, and wherein the first precision signal has a first bit resolution;
   generating a plurality of values of a second precision-limited signal by application of a lookup table (LUT), the values of the second precision-limited signal reflecting:
      a calculation of predicted error caused by a quantization of the first precision signal,
      an application of dithering to an error-transformed version of the first precision signal, wherein the error-transformed version of the first precision signal reflects a combination of the predicted error with the first precision signal, and wherein the error-transformed precision signal has more uniformly distributed error than the first precision signal, and
      a reverse error-transformation of the dithered error-transformed version of the first precision signal, wherein the reverse error-transformation reflects an inversion of the combination of the predicted error with the first precision signal; and
   generating values of a quantized version of the second precision-limited signal, wherein the second precision-limited signal has a second bit resolution, wherein the second bit resolution is lower than the first bit resolution, and wherein the second precision-limited signal meets a first quality level target.

9. The method of claim 8, wherein the predicted error represents the error between the first precision signal and a quantized version of the first precision signal.

10. The method of claim 9, wherein the combination of the predicted error with the first precision signal involves combining the inverse of the predicted error with the precision signal.

11. The method of claim 8, wherein the error between the first precision signal and the reverse error-transformed version of the first precision signal is evenly distributed.

12. The method of claim 8, wherein the calculation of the predicted error comprises:

determining error information;
normalizing the error information; and
calculating the inverse of the normalized error information.

13. The method of claim 8, wherein the LUT is used to generate values of a quantized version of the second precision-limited new-signal.

14. The method of claim 8, wherein the application of the LUT comprises the application of one or more functions.

15. The method of claim 8, wherein the first quality level target comprises at least one of: a black level target, or a noise level target.

16. A non-transitory computer readable medium comprising one or more instructions for improving signal quality of precision-limited signals, that, when executed, configure a processor to:
  receive a first precision signal, wherein the first precision signal carries audio and/or video information, and wherein the first precision signal has a first bit resolution;
  generate a plurality of values of a second precision-limited signal by application of a lookup table (LUT), the values of the second precision-limited signal reflecting:
    a calculation of predicted error caused by a quantization of the first precision signal;
    an application of dithering to an error-transformed version of the first precision signal, wherein the error-transformed version of the first precision signal reflects a combination of the predicted error with the first precision signal, and wherein the error-transformed precision signal has more uniformly distributed error than the first precision signal;
    a reverse error-transformation of the dithered error-transformed version of the first precision signal, wherein the reverse error-transformation reflects an inversion of the combination of the predicted error with the first precision signal; and
  generate values of a quantized version of the second precision-limited signal, wherein the second precision-limited signal has a second bit resolution, wherein the second bit resolution is lower than the first bit resolution, and wherein the second precision-limited signal meets a first quality level target.

17. The non-transitory computer readable medium of claim 16, wherein the processor is one or more of: a central processing unit (CPU), a digital signal processor (DSP), or a custom-designed circuit.

18. The non-transitory computer readable medium of claim 16, wherein the predicted error represents the error between the first precision signal and a quantized version of the first precision signal.

19. The non-transitory computer readable medium of claim 16, wherein the application of the LUT comprises the application of one or more functions.

20. The non-transitory computer readable medium of claim 16, wherein the first quality level target comprises at least one of: a black level target, or a noise level target.

* * * * *

UNITED STATES PATENT AND TRADEMARK OFFICE
CERTIFICATE OF CORRECTION

PATENT NO. : 10,321,164 B2
APPLICATION NO. : 15/275011
DATED : June 11, 2019
INVENTOR(S) : Kenneth I. Greenebaum et al.

It is certified that error appears in the above-identified patent and that said Letters Patent is hereby corrected as shown below:

In the Claims

Column 17 Line 7: Replace the phrase "new-signal" with the word --signal--.

Signed and Sealed this
Sixteenth Day of July, 2019

Andrei Iancu
*Director of the United States Patent and Trademark Office*